United States Patent
Kato et al.

(10) Patent No.: US 7,858,436 B2
(45) Date of Patent: Dec. 28, 2010

(54) SEMICONDUCTOR DEVICE, ITS MANUFACTURE METHOD AND TEMPLATE SUBSTRATE

(75) Inventors: Hiroyuki Kato, Yokohama (JP); Michihiro Sano, Odawara (JP)

(73) Assignee: Stanley Electric Co., Ltd., Tokyo (JP)

( * ) Notice: Subject to any disclaimer, the term of this patent is extended or adjusted under 35 U.S.C. 154(b) by 322 days.

(21) Appl. No.: 12/079,617

(22) Filed: Mar. 27, 2008

(65) Prior Publication Data
US 2008/0258142 A1 Oct. 23, 2008

(30) Foreign Application Priority Data
Mar. 29, 2007 (JP) .............................. 2007-087127

(51) Int. Cl.
H01L 21/16 (2006.01)
H01L 21/00 (2006.01)

(52) U.S. Cl. .......... 438/104; 257/E21.09; 257/E21.461; 438/22; 438/85; 438/481

(58) Field of Classification Search ........................ None
See application file for complete search history.

(56) References Cited

U.S. PATENT DOCUMENTS 3,664,867 A * 5/1972 Galli et al. .................. 428/336
6,664,565 B1 * 12/2003 Sano et al. ..................... 257/43
6,955,985 B2 * 10/2005 Narayan ...................... 438/681
7,432,526 B2 * 10/2008 Van de Walle et al. ......... 257/43
7,501,293 B2 * 3/2009 Ito et al. ......................... 438/22
7,605,012 B2 * 10/2009 Niki et al. ..................... 438/46
7,723,154 B1 * 5/2010 Adekore et al. ............. 438/104

FOREIGN PATENT DOCUMENTS

JP 2007-001787 A 1/2007

OTHER PUBLICATIONS

H. Kato et al; Homoepitaxial Growth of High-Quality Zn-Polar ZnO Films by Plasma-Assisted Molecular Beam Epitaxy; Japan J. Appl. Phys. vol. 42, Aug. 15, 2003.
H. Kato et al; High-Quality ZnO Epilayers Grown on Zn-face ZnO Substrates by Plasma Assisted Molecular Beam Epitaxy; Journal of Crystal Growth; 2004.

* cited by examiner

*Primary Examiner*—Zandra Smith
*Assistant Examiner*—Khanh B Duong
(74) *Attorney, Agent, or Firm*—Holtz, Holtz, Goodman & Chick, PC

(57) ABSTRACT

The semiconductor device has: a ZnO-containing substrate containing Li; a zinc silicate layer formed above the ZnO-containing substrate; and a semiconductor layer epitaxially grown relative to the ZnO-containing substrate via the zinc silicate layer.

6 Claims, 7 Drawing Sheets

ZnO[10-10]

[10-10]

ZnO[11-20]

[11-20]

SEMICONDUCTOR DEVICE, ITS MANUFACTURE METHOD AND TEMPLATE SUBSTRATE

CROSS REFERENCE TO RELATED APPLICATION

This application is based on and claims priority of Japanese Patent Application No. 2007-087127 filed on Mar. 29, 2007, the entire contents of which are incorporated herein by reference.

BACKGROUND OF THE INVENTION

A) Field of the Invention

The present invention relates to a semiconductor device and its manufacture method, and more particularly to a semiconductor device using a ZnO-containing substrate and its manufacture method. The present invention relates also to a template substrate usable for manufacturing the semiconductor device of this type.

B) Description of the Related Art

A hydrothermal method is used as a crystal growth method for zinc oxide (ZnO) for substrates. In the ZnO crystal growth by the hydrothermal synthesis, mixture aqueous solution of lithium hydroxide (LiOH) and potassium hydroxide (KOH) is used as minerizer. Because of this, Li is mixed at a high concentration of about $10^{17}$ cm$^{-3}$ to $10^{18}$ cm$^{-3}$ in a ZnO substrate manufactured by the hydrothermal method. As a ZnO layer is grown on a ZnO substrate containing Li, Li in the substrate is diffused in the ZnO layer on the substrate.

As a method of growing homoepitaxially a ZnO layer on a ZnO substrate, there are a method of forming a ZnO buffer layer at a low temperature on a ZnO substrate, thereafter performing annealing at a high temperature, and then growing a ZnO layer at a predetermined temperature, and a method of directly growing a ZnO layer on a ZnO substrate without involving a buffer layer. The details of these methods are described in "H. Kato, M. Sano, K. Miyamoto and T. Yao: Jpn. J. Appl. Phys. 42, L1002-L1005, 2003" and "H. Kato, M. Sano, K. Miyamoto and T. Yao: J. Crystal Growth 265, 375-381, 2004", the entire contents of both documents are incorporated herein by reference. A ZnO epitaxial growth temperature is desired to be high from a viewpoint of good crystallinity. However, the higher the growth temperature is, Li is more likely to diffuse.

FIG. 6 shows a depth profile of an Li concentration in a homoepitaxial ZnO layer grown directly on a ZnO substrate, measured by secondary ion mass spectrometry (SIMS). The abscissa represents a depth from the surface of the epitaxial layer of each sample, in the unit of μm, and the ordinate represents an Li concentration in the unit of cm$^{-3}$. Curves A1 to A3 are profiles measured at growth temperatures of 450° C., 650° C. and 800° C., respectively. It can be seen that the higher a growth temperature is, an Li concentration in the epitaxial layer increases.

Li as an group I element operates as an acceptor when Li is substituted for a Zn site in ZnO which is compound semiconductor of a group II-VI, whereas if Li enters between lattices, Li operates as a donor. These acceptors and donors adversely affect the electrical characteristics. The characteristics of a device using a ZnO-containing semiconductor are therefore influenced considerably.

FIG. 7 is a graph showing a relation between a Li concentration and an electron mobility in an undoped ZnO layer at a room temperature. As an Li concentration increases, an electron mobility decreases. It can therefore be known that carrier scattering occurs. An Li concentration not lower than $2\times10^{17}$ cm$^{-3}$ in particular demonstrates insulation, indicating that carriers are compensated.

JP-A-2007-1787, the entire contents of which are incorporated herein by reference, discloses techniques of lowering an Li concentration in a substrate by absorbing Li contained in a ZnO substrate manufactured by the hydrothermal method, by using material not containing Li.

SUMMARY OF THE INVENTION

It is desired to provide techniques capable of suppressing diffusion of Li into a semiconductor layer formed on a ZnO-containing substrate containing a large amount of Li such as a ZnO-containing substrate manufactured by the hydrothermal method.

An object of the present invention is to provide a semiconductor device capable of suppressing Li contained in a ZnO-containing substrate from being diffused into a semiconductor layer formed above the substrate, and a manufacture method for the semiconductor device of this type.

Another object of the present invention is to provide a template substrate applicable to the manufacture method for the semiconductor device of this type.

According to one aspect of the present invention, there is provided a semiconductor device comprising: a ZnO-containing substrate containing Li; a zinc silicate layer formed above the ZnO-containing substrate; and a semiconductor layer epitaxially grown relative to the ZnO-containing substrate via the zinc silicate layer.

The zinc silicate layer formed above the ZnO-containing substrate can suppress Li contained in the ZnO-containing substrate from diffusing through the zinc silicate layer.

DESCRIPTION OF THE PREFERRED EMBODIMENTS

Figure 5:
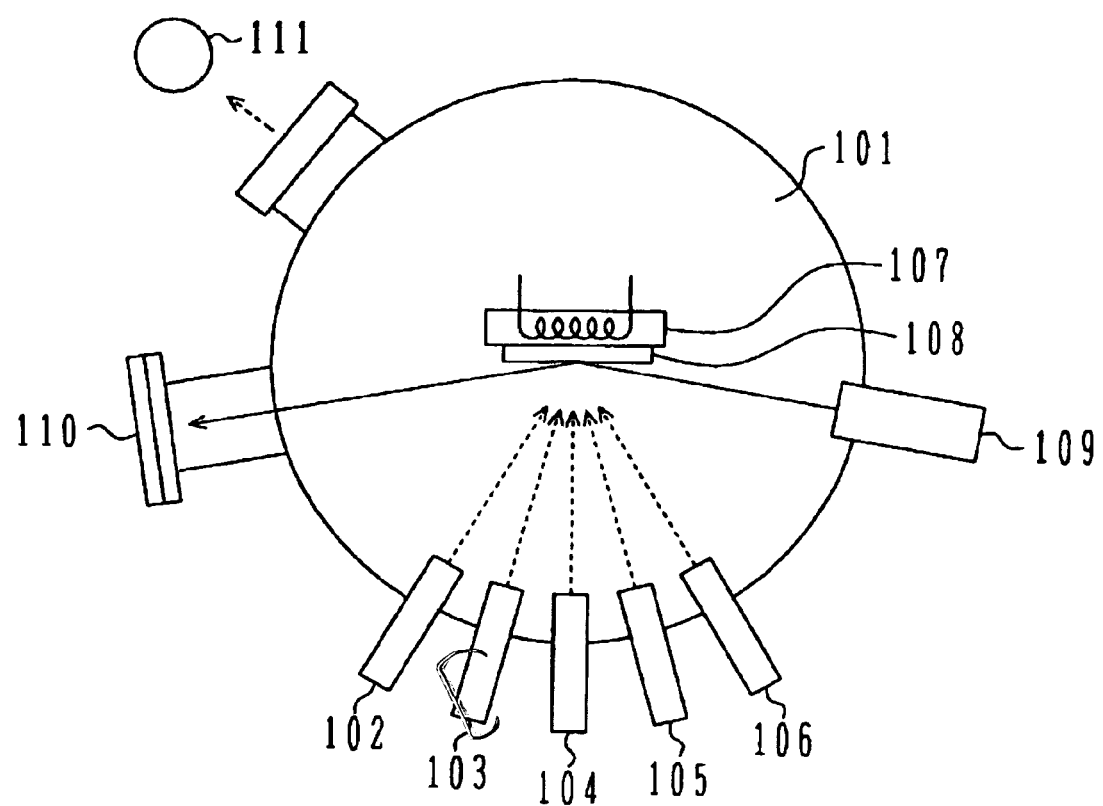
FIG. 5 is a schematic diagram showing an example of a crystal growth system for growing a ZnO-containing compound semiconductor layer.

First, with reference to FIG. 5, description will be made on an example of a crystal growth system (film forming system) for growing a zinc oxide (ZnO) containing semiconductor layer. Molecular beam epitaxy (MBE) is used as a film forming method. A substrate heater 107 is disposed in a vacuum chamber 101, and holds a substrate 108.

The vacuum chamber 101 is equipped with a zinc (Zn) source gun 102, an oxygen (O) source gun 103, a gallium (Ga) source gun 104, a nitrogen (N) source gun 105 and a magnesium (Mg) source gun 106. The Zn source gun 102, Ga source gun 104 and Mg source gun 106 have Knudsen cells for accommodating Zn, Ga and Mg solid sources, respectively, to irradiate Zn, Ga and Mg beams respectively. The O source gun 103 and N source gun 105 each include an electrodeless discharge tube using a high frequency (e.g., 13.56 MHz), and radicals of oxygen and nitrogen gases are generated in the electrodeless discharge tubes to irradiate O and N radical beams.

By supplying desired beams to the substrate 108, ZnO-containing compound semiconductor having a desired composition can be grown. Also mounted on the vacuum chamber 101 are a reflection high energy electron diffraction (RHEED) gun 109 and a screen 110 for displaying an RHEED image. It is possible to evaluate crystallinity of a layer formed on the substrate 108 from an RHEED image. An exhaust pump 111 vacuum-exhausts the inside of the vacuum chamber 101.

Figure 1A:
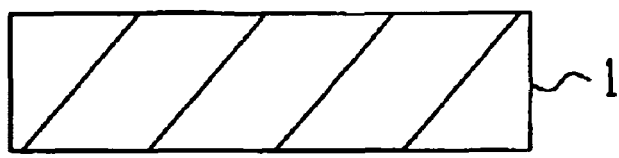
FIGS. 1A to 1E are schematic cross sectional views of a substrate illustrating a ZnO-containing semiconductor layer growing method according to a first embodiment of the present invention.

Next, description will be made on a ZnO-containing semiconductor layer according to the first embodiment of the present invention. First, as shown in FIG. 1A, a ZnO substrate 1 is prepared. This substrate was cut from a ZnO single crystal grown by the hydrothermal method. As described in the column "DESCRIPTION OF THE RELATED ART", Li is mixed in the ZnO substrate formed by the hydrothermal method, at a high concentration of about $10^{17}$ cm$^{-3}$ to $10^{18}$ cm$^{-3}$.

Figure 1B:
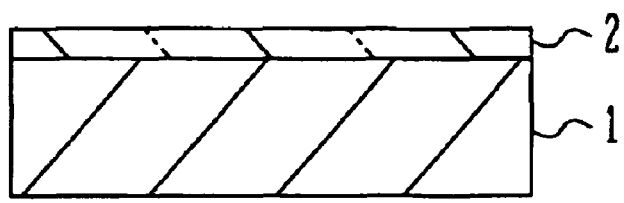

Next, as shown in FIG. 1B, a silicon oxide layer 2 is formed on the ZnO substrate 1. For example, colloidal silica having a grain diameter of about 50 nm is coated on the surface of the ZnO substrate to form an amorphous SiO$_2$ layer. A film formed by coating colloidal silica is considered not to have a thickness of a multilayer film.

Next, the ZnO substrate 1 formed with the silicon oxide film 2 is set in the vacuum chamber of the MBE system, and is subjected to heat treatment, for example, for 1 hour at 900° C. in vacuum.

Figure 1C:
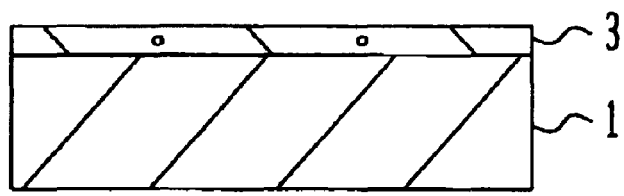

As shown in FIG. 1C, this heat treatment forms a zinc silicate layer 3. This layer is formed by a reaction of $2\,ZnO + SiO_2 \rightarrow Zn_2SiO_4$.

RHEED patterns obtained by this heat treatment will be described with reference to FIGS. 2A to 2D. The RHEED patterns shown in FIGS. 2A to 2D are a pattern in a [11-20] direction of a ZnO crystal, a pattern in a [10-10] direction of the ZnO crystal, a pattern in the [11-20] direction after the heat treatment, and a pattern in the [10-10] direction after the heat treatment, respectively.

The ZnO crystal patterns (FIGS. 2A and 2B) indicate a (1×1) pattern. Namely, diffraction lines of 0-th and first orders appear in both the [11-20] and [10-10] directions, and it can be known that the patterns have a periodical surface structure of a one-fold.

Figure 2B:
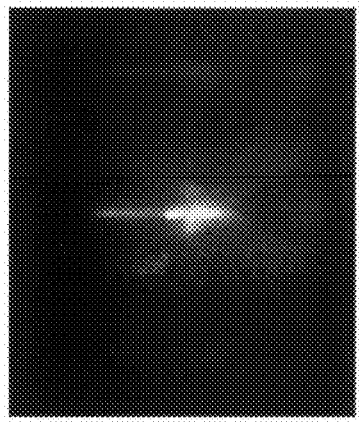
FIGS. 2A to 2D show RHEED patterns.
Figure 2D:
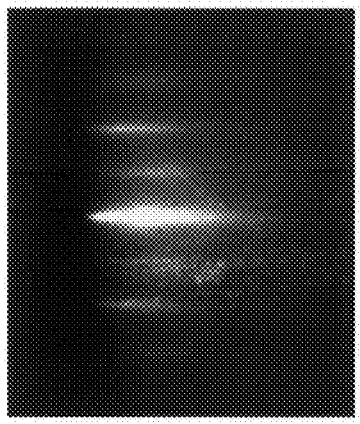
Figure 2A:
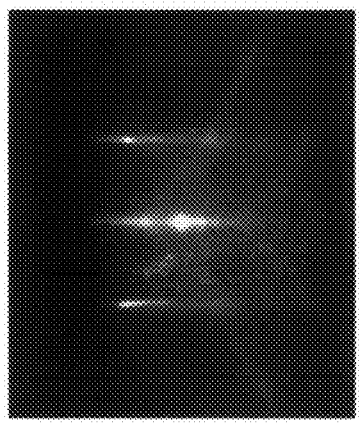
Figure 2C:
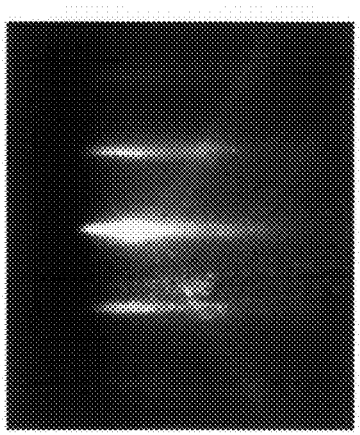

The patterns after heat treatment (FIGS. 2C and 2D) indicate a (1×3) reconstruction pattern. Namely, diffraction lines of 0-th and ± first orders appear in the [11-20] direction (FIG. 2C), and diffraction lines of 0-th and ± first orders as well as diffraction lines of ±⅓-th to ⅔-th orders equally dividing spaces between 0-th and ± first orders by 3 appear in the [10-10] direction (FIG. 2D). It can be known that the patterns have a periodical surface structure of a one-fold in the [11-20] direction and a periodical surface structure of a three-fold in the [10-10] direction.

It can be considered that the (1×3) reconstruction pattern can be observed because the heat treatment forms a Zn$_2$SiO$_4$ crystal. It can therefore be judged that the zinc silicate layer 3 was formed, if the RHEED patterns on the substrate surface (silicon oxide layer surface) in the [11-20] and [10-10] directions indicate the (1×3) reconstruction pattern observed during the heat treatment.

The method of forming the silicon oxide layer 2 is not limited to coating colloidal silica. For example, coating liquid for an SiO$_2$-containing cover film may be coated. It can also be considered that an SiO$_2$ film may be formed by sputtering or pulse laser deposition (PLD). A thickness of the silicon oxide layer 2 may be about 1 nm to 100 nm, or more preferably about 1 nm to 50 nm. A crystalline state of the silicon oxide layer 2 is desired to be an amorphous state.

A temperature of the heat treatment for forming the zinc silicate layer 3 is not limited to 900° C., but 800° C. or higher is desirous. This heat treatment may not be performed in vacuum, but it may be performed in the atmospheric air. The zinc silicate layer 3 may be epitaxially grown directly on the ZnO substrate 1.

Figure 1D:
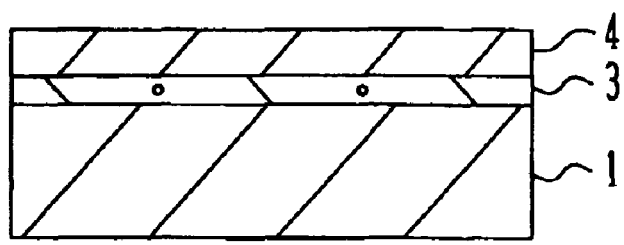

Next, as shown in FIG. 1D, a ZnO buffer layer 4 is grown at a low temperature not higher than 500° C. (e.g., 300° C.), for example, to a thickness of 50 nm. Thereafter, annealing is performed, for example, for 20 minutes at 900° C. to improve crystallinity and flatness of the ZnO buffer layer 4.

Figure 1E:
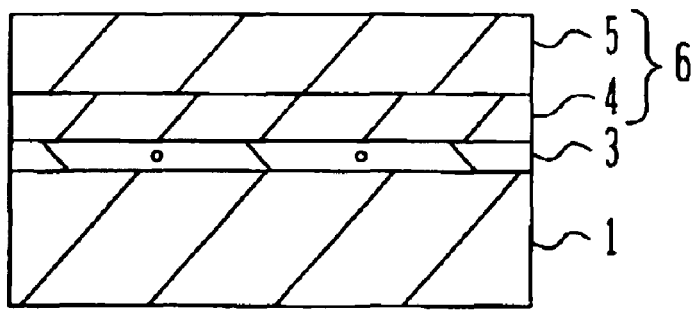

Next, as shown in FIG. 1E, a ZnO layer 5 is epitaxially grown on the buffer layer 4, for example, to a thickness of 900 nm at 700° C. ZnO epitaxial growth forms an RHEED (1×1) pattern.

The annealed buffer layer 4 and the ZnO layer 5 epitaxially grown on the buffer layer 4 constitute a ZnO layer 6 epitaxially grown relative to the ZnO substrate 1 via the zinc silicate layer 3.

Figure 3A:
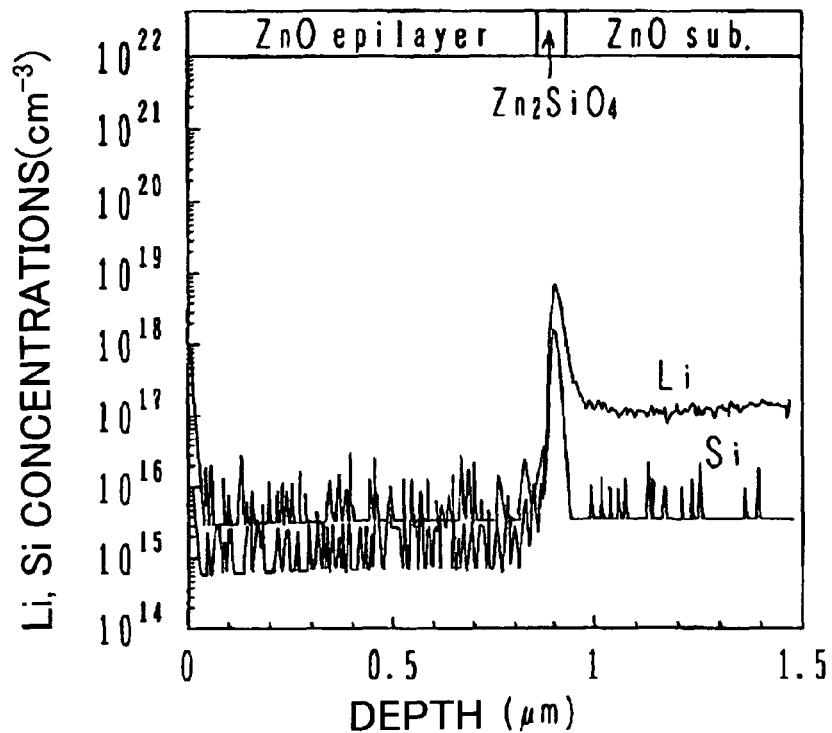
FIG. 3A is a depth profile of an Li concentration in a ZnO layer of the first embodiment.
Figure 3B:
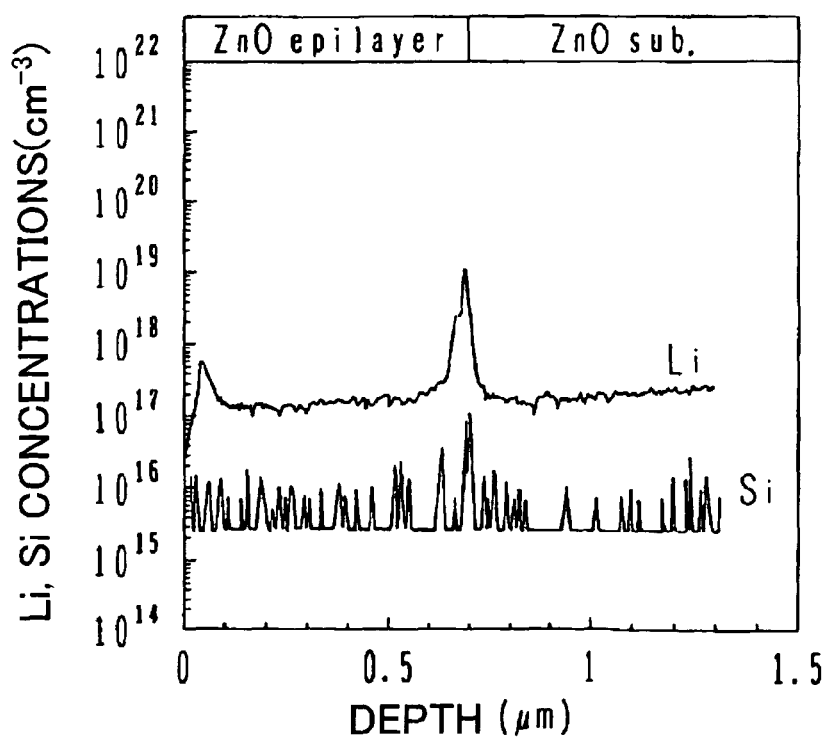
FIG. 3B is a depth profile of an Li concentration in a ZnO layer of a comparative example.

FIG. 3A shows a SIMS depth profile of an Li concentration in the ZnO layer grown by the first embodiment method. The abscissa represents a depth from the surface of the epitaxial layer of a sample in the unit of μm, and the ordinate represents an Li concentration in the unit of cm$^{-3}$. An Si concentration is also shown in the same graph. As a comparative example, FIG. 3B shows a SIMS depth profile of Li and Si concentrations in a ZnO layer grown by a conventional method (a method not forming the zinc silicate layer).

In the sample formed by the conventional method, the Li concentration in the ZnO layer epitaxially grown on the substrate is almost equal to that in the substrate and is about $2\times10^{17}$ cm$^{-3}$. It can be understood that Li in the substrate diffuses into the epitaxial layer. The Li concentration is high at the interface between the substrate and epitaxial layer and there is a tendency that Li is trapped at this interface. However, diffusion of Li from the substrate into the epitaxial layer is not suppressed.

In the sample formed by the embodiment method, the Li concentration (an average concentration along the depth direction) is about $1\times10^{17}$ cm$^{-3}$ in the substrate, whereas the Li concentration in the epitaxial layer has a level lower than $1\times10^{16}$ cm$^3$. A region having a high Si concentration exists between the substrate and epitaxial layer, this region corresponding to the zinc silicate layer. The Si concentrations in the substrate and epitaxial layer are almost equal. It can be understood that the zinc silicate layer of the sample obtained by the embodiment method functions as a diffusion preventive layer for suppressing Li diffusion from the substrate into the epitaxial layer. The Li concentration of the embodiment sample is also high in the zinc silicate layer between the substrate and epitaxial layer.

There is a variation in Li concentrations of substrates, the variation being at least about one digit (e.g., $10^{17}$ cm$^{-3}$ to $10^{18}$ cm$^{-3}$).

As described above, by forming a zinc silicate layer above the ZnO substrate, Li in the ZnO substrate can be suppressed from being diffused upwards through the zinc silicate layer. It is therefore possible to epitaxially grow a ZnO-containing semiconductor layer having a low Li concentration. As a semiconductor device is manufactured by using the ZnO-containing semiconductor layer formed in the manner described above, electrically adverse effects to be caused by Li can be reduced and the device performance improvement can be expected.

Figure 6:
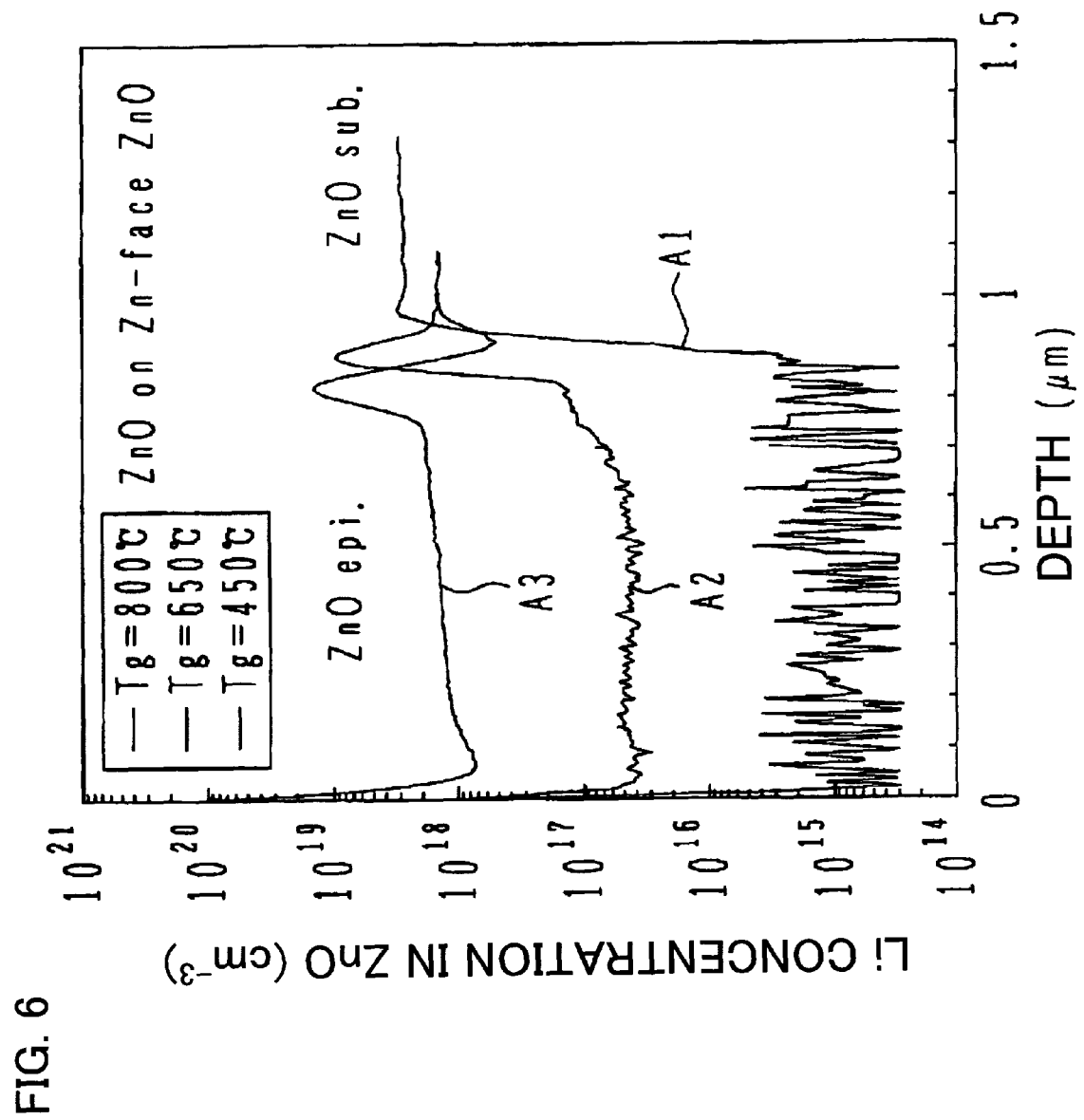
FIG. 6 is a depth profile of an Li concentration in a conventional ZnO layer.

Li diffusion from the substrate is likely to occur (refer also to FIG. 6) if a growth temperature of a ZnO-containing semiconductor layer is not lower than 600° C. If a ZnO-containing semiconductor layer is formed at a temperature not lower than 600° C. in particular, Li diffusion suppression by the zinc silicate layer is considered to be effective.

Figure 7:
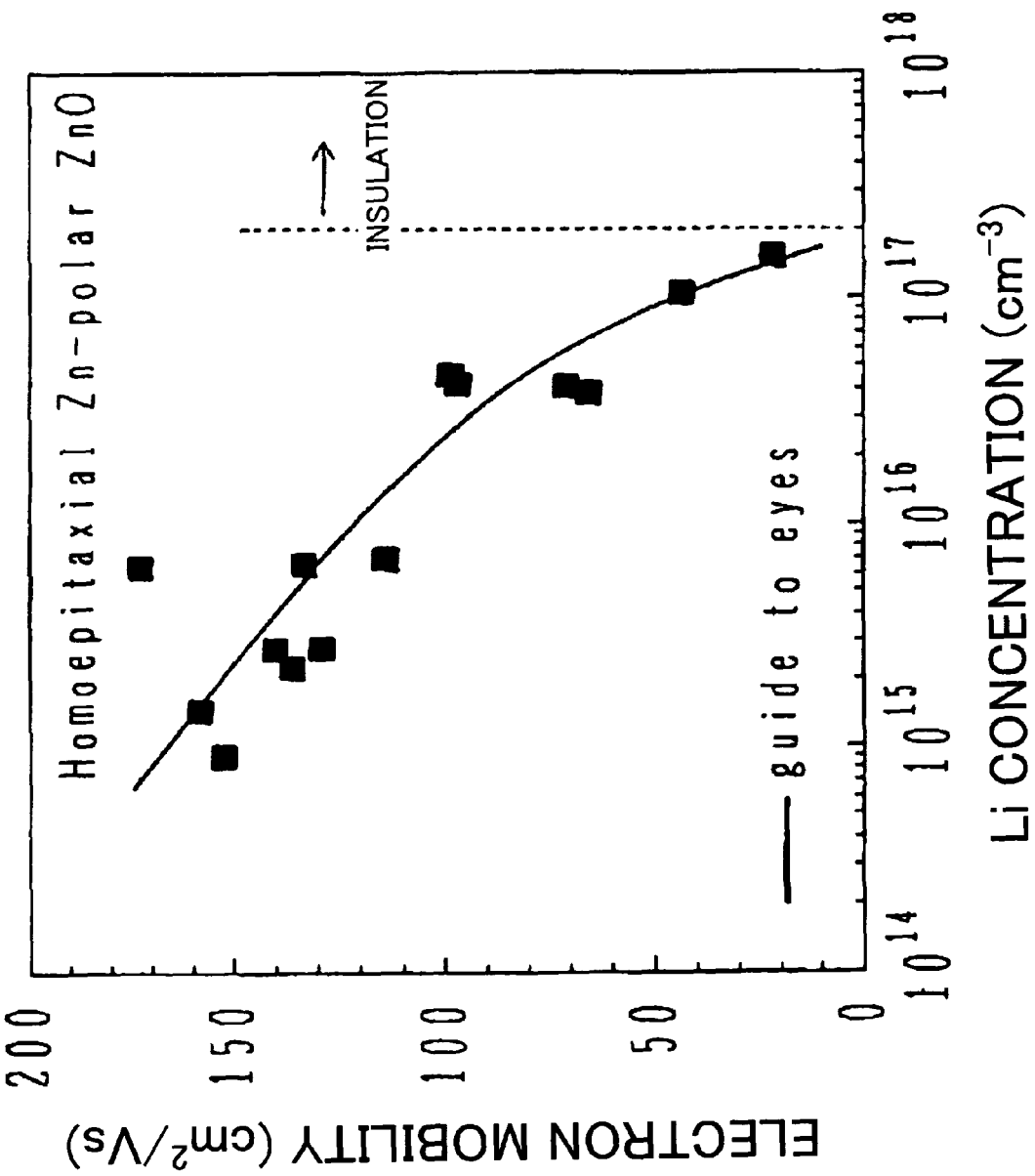
FIG. 7 is a graph showing the relation between an Li concentration and an electron mobility in ZnO.

If an Li concentration in the ZnO substrate is not lower than $1\times10^{16}$ cm$^{-3}$ in particular, it is desired to suppress Li diffusion from the substrate (refer also to FIG. 7). If the Li concentration in the ZnO substrate is not lower than $1\times10^{16}$ cm$^{-3}$, it can be considered that the Li diffusion suppression by the zinc silicate layer is particularly effective.

Figure 4A:
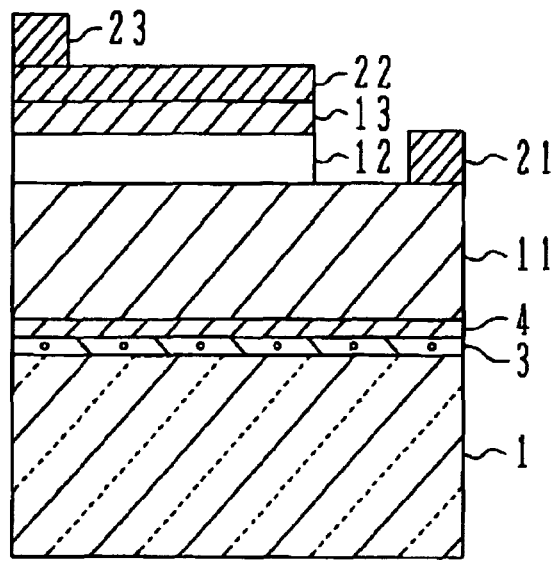
FIG. 4A is a schematic cross sectional diagram of a light emitting device according to a second embodiment.

Next, description will be made on a light emitting device manufacture method according to the second embodiment, by applying the ZnO-containing semiconductor layer growth method of the first embodiment. FIG. 4A is a schematic cross sectional view of a light emitting device of the second embodiment. Similar to the first embodiment, a zinc silicate layer 3 is formed on a ZnO substrate 1, a ZnO buffer layer 4 is formed on the zinc silicate layer 3, and the buffer layer 4 is annealed.

Next, an n-type ZnO layer 11 doped with Ga is formed on the buffer layer 4. The n-type ZnO layer 11 is grown by irradiating a Zn beam, an O radical beam and a Ga beam at the same time to the substrate heated, e.g., to 500° C. to 1000° C. For example, a thickness of the n-type ZnO layer 11 is preferably 1 μm to 2 μm, and a Ga concentration is preferably $1\times10^{18}$ cm$^{-3}$ or higher.

Figure 4B:
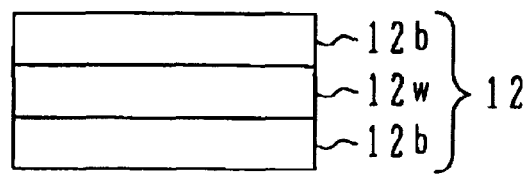
FIGS. 4B and 4C are schematic cross sectional views showing examples of a luminous layer.
Figure 4C:
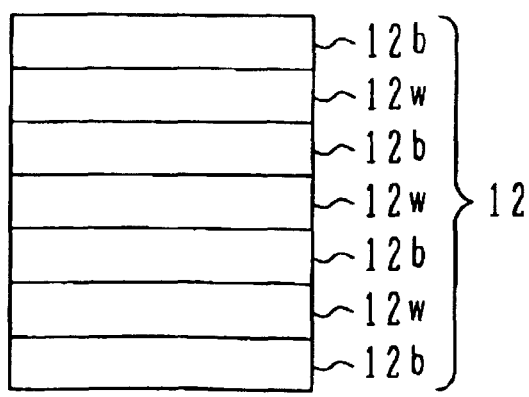

Next, a luminous layer 12 is formed on the n-type ZnO layer 11. The luminous layer 12 has a quantum well structure having, for example, a ZnO layer as a well layer and ZnMgO layers as barrier layers. For example, as shown in FIG. 4B, the luminous layer 12 is manufactured by forming one cycle of a lamination structure of a ZnO well layer 12w stacked on a ZnMgO barrier layer 12b and forming a ZnMgO barrier layer 12b as the uppermost layer. For example, as shown in FIG. 4C, the luminous layer 12 may have a multilayer quantum well structure having a plurality of the above-described lamination structures.

The well layer 12w is grown by irradiating a Zn beam and an O radical beam at the same time to the substrate heated, for example, to 500° C. to 1000° C. The barrier layer 12b is grown by irradiating a Zn beam, an O radical beam and an Mg beam at the same time on the substrate heated, for example, to 350° C. to 800° C.

Next, a p-type ZnO layer 13 doped with N is formed on the luminous layer 12. The p-type ZnO layer 13 is grown by irradiating a Zn beam, an O radical beam and an N radical beam at the same time to the substrate heated, for example, to 500° C. to 1000° C. For example, a thickness of the p-type ZnO layer 13 is preferably 100 nm to 200 nm and an N concentration is preferably $1\times10^{19}$ cm$^{-3}$ or higher.

Next, an electrode is formed. The wafer formed up to the p-type ZnO layer 13 is taken out of the film forming system, and thereafter a resist film, a protective film or the like is formed on the p-type ZnO layer 13 and patterned to form an etching mask having a cutout widow corresponding to an area where an n-side electrode is to be formed. By using this etching mask, the p-type ZnO layer 13 and luminous layer 12 are etched, for example, by wet etching or reactive ion etching to expose the n-type ZnO layer 11.

Next, a Ti layer having a thickness of, e.g., 2 nm to 10 nm is formed on the surface of the exposed n-type ZnO layer 11, and an Al layer having a thickness of, e.g., 300 nm to 500 nm is stacked on the Ti layer to thereby form the n-side electrode 21. After the n-side electrode 21 is formed, the etching mask is removed.

Next, an Ni layer having a thickness of, e.g., 0.5 nm to 1 nm is formed on the surface of the p-type ZnO layer 13, and an Au layer having a thickness of, e.g., 10 nm is stacked on the Ni layer to thereby form a p-side electrode 22. Further, a bonding electrode 23 made of an Au layer having a thickness of, e.g., 500 nm is formed on the p-side electrode 22. In order not to stack the materials of the p-side electrode 22 and bonding electrode 23 on the n-side electrode 21, the p-side electrode 22 and bonding electrode 23 are formed by using proper masks.

After these electrodes are formed, an electrode alloying process is executed in an oxygen atmosphere, for example, at a temperature of 400° C. to 800° C. An alloying process time is, e.g. 1 to 10 minutes. In the manner described above, the light emitting device of the second embodiment is manufactured.

As described above, a semiconductor device can be manufactured which uses a ZnO-containing semiconductor layer formed above the zinc silicate layer for preventing Li diffusion from the ZnO substrate. Since unnecessary dopant Li reduces in the ZnO-containing semiconductor layer, it is expected that conductivity control can be made easily. It is expected particularly that N is activated properly and the p-type ZnO layer can be manufactured easily.

A template substrate having a zinc silicate layer formed beforehand on a ZnO substrate may be prepared to manufacture a semiconductor device on the template substrate.

Although MBE is used as a crystal growth method in the above embodiments, the crystal growth method is not limited thereto. For example, it is considered that metal organic chemical vapor deposition (MOCVD) or pulse laser deposition (PLD) may be used.

Although a ZnO-containing semiconductor layer is formed on a ZnO substrate in the foregoing description, it can be considered that the ZnO substrate is used as, for example, a GaN epitaxial growth substrate having a lattice constant near to that of ZnO. A high Li concentration is not electrically preferable also when a GaN-containing semiconductor layer is grown, similar to when a ZnO-containing semiconductor layer is grown. When the GaN-containing semiconductor layer is grown, it can be considered that preventing an Li diffusion from the substrate by the zinc silicate layer is effective.

Even if a ZnO-containing substrate is made of a ZnO substrate containing another element and the ZnO-containing substrate contains Li, Li diffusion from the substrate is expected to be prevented by the zinc silicate layer.

If Mg is introduced into ZnO, the ZnO-containing semiconductor can be obtained which has a broader band gap than that of ZnO. It is possible to introduce Mg into ZnO about 35% without distorting a crystal too much. However, if Mg is introduced 50% or more, it is considered that phase separation occurs. Namely, being represented by $Zn_{1-x}Mg_xO$, $0 \leq x < 0.5$ is preferable and $0 \leq x \leq 0.35$ is more preferable.

For example, even if a ZnO-containing substrate made of ZnMgO containing Mg is manufactured and this substrate contains Li, the Li diffusion preventing techniques by the zinc silicate is expected to be effective. Mg is possibly introduced in a zinc silicate layer formed by forming a silicon oxide layer on this ZnO-containing substrate and subjected to heat treatment.

Although a light emitting diode (LED) is formed in the above description, a laser diode (LD) may be formed by forming a cavity through cleavage. Products applying these light emitting devices may also be formed such as various indicators, displays, and light sources for optical disks.

A white LED may be formed by combining an LED and phosphor. Products applying the white LED may also be formed such as illumination instruments, various indicators, displays, and back lights of various display monitors.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device manufacture method comprising steps of:
   (a) preparing a ZnO-containing substrate containing Li;
   (b) forming a zinc silicate layer above said ZnO-containing substrate; and
   (c) epitaxially growing a semiconductor layer relative to said ZnO-containing substrate via said zinc silicate layer.

2. The semiconductor device manufacture method according to claim 1, wherein said step (b) comprises steps of (b1) forming a silicon oxide layer on said ZnO-containing substrate, and (b2) performing heat treatment for said ZnO-containing substrate formed with said silicon oxide layer.

3. The semiconductor device manufacture method according to claim 2, wherein said step (b1) forms said silicon oxide layer by coating colloidal silica on said ZnO-containing substrate.

4. The semiconductor device manufacture method according to claim 2, wherein said step (b2) performs the heat treatment at a temperature not lower than 800° C.

5. The semiconductor device manufacture method according to claim 2, wherein said step (b2) includes a step of observing RHEED patterns in [11-20] and [10-10] directions on a surface of said silicon oxide layer, and performs the heat treatment until (1×3) reconstruction patterns are obtained.

6. The semiconductor device manufacture method according to claim 1, wherein said semiconductor layer in said step (c) is a ZnO-containing semiconductor layer.

* * * * *